(12) United States Patent
Limberg

(10) Patent No.: US 6,421,403 B1
(45) Date of Patent: Jul. 16, 2002

(54) BASEBAND EQUALIZATION OF QUADRATURE-PHASE AS WELL AS IN-PHASE SYNCHRODYNE RESULTS IN DIGITAL RADIO RECEIVERS

(75) Inventor: Allen LeRoy Limberg, Vienna, VA (US)

(73) Assignee: Samsung Electronics Co., Ltd., Kyungki-do (KR)

( * ) Notice: Subject to any disclaimer, the term of this patent is extended or adjusted under 35 U.S.C. 154(b) by 180 days.

(21) Appl. No.: 09/624,242

(22) Filed: Jul. 24, 2000

Related U.S. Application Data
(60) Provisional application No. 60/145,211, filed on Jul. 23, 1999, provisional application No. 60/138,108, filed on Jun. 7, 1999, and provisional application No. 60/132,874, filed on May 5, 1999.

(51) Int. Cl.[7] .................................................. H03D 1/04
(52) U.S. Cl. ........................ 375/346; 375/316; 348/614
(58) Field of Search ................................. 375/316, 346, 375/321, 350; 348/614, 607

(56) References Cited

U.S. PATENT DOCUMENTS 6,081,301 A * 7/2000 Limberg ..................... 348/614

6,313,885 B1 * 11/2001 Patel et al. ................ 348/614

* cited by examiner

Primary Examiner—Temesghen Ghebretinsae
(74) Attorney, Agent, or Firm—Sughrue Mion, PLLC

(57) ABSTRACT

A bandpass tracking demodulator for digital radio signals, such as DTV signals, provides an in-phase baseband demodulation result which is subjected to equalization and ghost-cancellation filtering before symbol decoding. The bandpass tracking demodulator also provides a quadrature-phase baseband demodulation result, which is processed to provide automatic frequency and phase control (AFPC) signal to a local oscillator used in downconverting the digital radio signal to the intermediate-frequency signal that is subsequently demodulated. Multi-path distortion of the in-phase baseband demodulation result is reduced by subjecting the quadrature-phase baseband demodulation result to equalization and ghost-cancellation filtering similar to that the in-phase baseband demodulation result is subjected to. Using dual-phase equalization and ghost-cancellation filtering for the in-phase and quadrature-phase baseband demodulation results is preferable in that the same set of digital multipliers processes both streams of baseband demodulation results, avoiding the need for a further set of digital multipliers.

6 Claims, 8 Drawing Sheets

BASEBAND EQUALIZATION OF QUADRATURE-PHASE AS WELL AS IN-PHASE SYNCHRODYNE RESULTS IN DIGITAL RADIO RECEIVERS

This application is filed under 35 U.S.C. 111(a) claiming pursuant to 35 U.S.C. 119(e)(1) benefit of the filing dates of provisional application ser. No. 60/132,874 filed May 5, 1999, pursuant to 35 U.S.C. 111(b); of provisional application ser. No. 60/138,108 filed Jun. 7, 1999, pursuant to 35 U.S.C. 111(b); and of provisional application ser. No. 60/145,211 filed Jul. 23, 1999, pursuant to 35 U.S.C. 111(b).

The invention relates to digital filters used for channel equalization and cancellation of multipath distortion in digital communications radio receivers, such as those employed in digital television receivers.

BACKGROUND OF THE INVENTION

A known configuration of channel equalizer employs a precursor finite-impulse-response (FIR) digital filter followed by a postcursor infinite-impulse-response (IIR) digital filter. The postcursor filter comprises a digital subtractor receiving the IIR precursor filter response as minuend input signal, a quantizer for quantizing the difference output signal from the subtractor, and a feedback FIR digital filter responding to the quantizer output signal for supplying subtrahend input signal to the subtractor. The postcursor filter suppresses post-ghost signals arriving after the principal signal. The precursor filter is commonly called a "feed-forward FIR filter" to distinguish it from the feedback FIR filter in the postcursor filter. The feed-forward FIR filter combines match filtering to reduce intersymbol interference, filtering to suppress pre-ghost signals arriving before the principal signal, and filtering to suppress artifacts otherwise arising in the postcursor filter. Clocking of the digital filters in the channel equalizer must at a rate at least as high as symbol rate in order to satisfy the well-known Nyquist criterion for pulse reproduction without irreparable intersymbol interference (ISI) being introduced.

In a process known as "synchronous equalization" the received signal is subjected to various delays that are multiples of the symbol interval and is summed with the delayed signals in a weighted summation procedure to suppress multipath distortion. Synchronous equalization has been employed in adaptive channel equalizers in which the feed-forward and feedback FIR filters are clocked at symbol rate. In such adaptive channel equalizers the coefficients of the feed-forward and feedback FIR filters are adjusted during operation by a process known as "decision feedback". Error signal for the decision feedback method is generated by comparing the output signal from the quantizer with its input signal, both signals being clocked at symbol rate.

In a process known as "fractional equalization" the received signal is subjected to various delays that are multiples of a specified fraction of the symbol interval and is summed with the delayed signals in a weighted summation procedure to suppress multipath distortion. Equalization at band edges is known to be much improved in a channel equalizer clocked at twice symbol rate, in which channel equalizer the received signal is subjected to various delays that are multiples of one-half of one symbol epoch. It has been observed that substantially the same degree of improvement can be obtained with a channel equalizer filter with substantially fewer taps, which filter is clocked at three-halves symbol rate. In such channel equalizer the received signal is subjected to various delays that are multiples of two-thirds of one symbol epoch.

In over-the-air digital television, transmission channel characterization is subject to considerable change with time and adaptive coefficient equalization is a practical necessity for a DTV receiver to be commercially acceptable. There is a desire to employ decision feedback techniques for adjusting the coefficients in the feed-forward and feedback FIR filters in order to track changing multipath conditions. Fractional equalization is preferred in the adaptive channel equalizer, so there is less criticality as to the timing of sampling in the component filters. Decision feedback techniques for adjusting the coefficients of a fractional equalizer properly are described by A. L. R. Limberg and C. B. Patel in U.S. patent application ser. No. 09/373,588 filed Aug. 13, 1999 and titled "ADAPTIVE FRACTIONALLY SPACED EQUALIZER FOR RECEIVED RADIO TRANSMISSIONS WITH DIGITAL CONTENT, SUCH AS DTV SIGNALS", claiming priority from a similarly titled provisional U.S. patent application ser. No. 60/097,614 filed Aug. 24, 1998.

U.S. Pat. No. 5,479,449 titled "DIGITAL VSB DETECTOR WITH BANDPASS PHASE TRACKER, AS FOR INCLUSION IN AN HDTV RECEIVER", which issued Dec. 26, 1995 to A. L. R. Limberg and C. B. Patel, describes the demodulation of digital television (DTV) signals reposing in an intermediate-frequency (I-F) band offset from zero frequency by no more than a few megahertz. These intermediate-frequency DTV signals are digitized and are then synchrodyned to baseband in the digital regime to recover in-phase and quadrature-phase baseband signals. The in-phase baseband signal contains symbol code that is symbol decoded, error-corrected, and de-randomized in successive signal processing steps. The quadrature-phase baseband signal is lowpass filtered to generate automatic frequency and phase control (AFPC) signal for a local oscillator that is used in the downconversion of the DTV signals to the I-F band offset from zero frequency by no more than a few megahertz.

Passband equalization done on orthogonal components of a digitized I-F signal before digital demodulation to baseband is preferred when the received signal has both upper and lower sideband components. The vestigial sideband (VSB)signals proposed for DTV broadcasting have essentially no lower sideband components, however, so baseband equalization has been used. The customary practice in DTV receiver designs that use baseband equalization has been to equalize just the in-phase baseband signal. The number of digital multipliers that baseband equalization uses for applying weighting coefficients to the kernel taps of the equalization filter is then half the number that would be used in equivalent passband equalization of the DTV signals.

It is here pointed out that the bandpass tracker type of demodulator for DTV signals shares a problem with any other synchronous demodulation scheme in which a local oscillator used in downconversion has automatic frequency and phase control (AFPC) of its local oscillations in which AFPC signal is developed by lowpass filtering the quadrature-phase baseband signal. AFPC seeks to adjust the carrier phasing of the synchrodyne to baseband to minimize the direct component of the quadrature baseband signal. If the in-phase baseband signal is equalized to suppress ghosts, but the quadrature-phase baseband signal is not, the presence of a ghost of appreciable strength will perturb the phase of the AFPC'd local oscillator from the correct phasing for an unghosted quadrature-phase baseband signal. This means that the phase of the AFPC'd local oscillator will not be the correct phasing for an unghosted in-phase baseband signal either. This results in a lower amplitude in-phase baseband signal than would be recovered were the phase of the AFPC'd local oscillator correct. When the multipath conditions are static, the equalizer corrects the amplitude of this lower-amplitude in-phase baseband signal. This correction introduces error in the equalizer response to the principal signal vis-a-vis the response to the static ghosts, which compensates for the phase error in the tracking of the in-phase and quadrature-phase baseband signals. When the multipath conditions change, the adaptation of the equalizer coefficients is generally slow in responding to the change, so the error in the equalizer response to the principal signal vis-a-vis the response to the static ghosts tends to persist. However, the phase error in the tracking of the in-phase and quadrature-phase baseband signals changes immediately as the multipath conditions change. Accordingly, the suppression of static ghosts by the equalizer is affected by dynamic ghosts, which poses a particularly serious problem during data slicing if there is a strong static ghost.

Suppose the in-phase and quadrature-phase baseband signals are each subjected to similar equalization filtering to suppress ghosts. Then, when the multipath conditions are static, the AFPC loop adjusts the phase of the AFPC'd local oscillator to be correct for both the in-phase and quadrature-phase baseband signals. And, when the multipath conditions change, the action of the AFPC loop to follow the phase of the quadrature-phase baseband signal is tracked with regard to the phase of the in-phase baseband signal. The suppression of static ghosts by the equalizer is little affected by the dynamic ghost. The AFPC loop for the local oscillator can have a faster time constant than the adaptation of the filter coefficients by decision feedback so that the dynamic ghost can be tracked.

Fractional equalization can be done using digital filtering operated at a sample rate higher than that corresponding to the kernel tap spacing for obtaining fractional equalization, as described in the above-referenced U.S. patent application ser. No. 09/373,588 filed Aug. 13, 1999 and titled "ADAPTIVE FRACTIONALLY SPACED EQUALIZER FOR RECEIVED RADIO TRANSMISSIONS WITH DIGITAL CONTENT, SUCH AS DTV SIGNALS".

This permits the fractional equalizer to be operated as a plural-phase filter that can equalize quadrature-phase baseband signal as well as in-phase baseband signal without the need for separate multipliers for weighting the kernel taps of a separate fractional equalizer for the in-phase baseband signal.

SUMMARY OF THE INVENTION

In a radio receiver for digital transmissions, which receiver downconverts the digital transmissions using a local oscillator with automatic frequency and phase control based on synchronously demodulated quadrature-phase baseband signal, adaptive channel equalization is applied to the synchronously demodulated quadrature-phase baseband signal, as well as to synchronously demodulated in-phase baseband signal.

In preferred embodiments of the invention the adaptive channel equalization filter is clocked at a sampling rate that is a multiple of symbol rate, employs decision feedback for adjusting the coefficients of its component filters, and is operated as a plural-phase filter for filtering the in-phase and quadrature-phase baseband signals using the same digital multipliers. The channel equalization filter subjects the samples of in-phase baseband demodulation result to fractional equalization at $(n+1)/n$ times symbol rate or baud rate, n being a positive integer. The channel equalization filter also subjects the samples of quadrature-phase baseband demodulation result to fractional equalization at the $(n+1)/n$ times symbol rate or baud rate.

BRIEF DESCRIPTION OF THE DRAWING

FIGS. 1A and 1B are the left and right portions respectively of a FIG. 1 that can be formed by combining FIGS. 1A and 1B, which FIG. 1 is a schematic diagram of portions of a digital television receiver including a channel equalizer constructed in accordance with the invention to process both in-phase and quadrature-phase baseband signals demodulated from digital television signals, which channel equalizer is a fractional equalizer with taps at two-thirds-symbol intervals.

FIGS. 2A and 2B are the left and right portions respectively of a FIG. 2 that can be formed by combining FIGS. 2A and 2B, which FIG. 2 is a schematic diagram of portions of a digital television receiver including a channel equalizer constructed in accordance with the invention to process both in-phase and quadrature-phase baseband signals demodulated from digital television signals, which channel equalizer is a fractional equalizer with taps at one-half-symbol intervals.

FIGS. 3A and 3B are the left and right portions respectively of a FIG. 1 that can be formed by combining FIGS. 3A and 3B, which FIG. 3 is a schematic diagram of portions of a digital television receiver including a channel equalizer constructed in accordance with the invention to process both in-phase and quadrature-phase baseband signals demodulated from digital television signals, which channel equalizer is a fractional equalizer with taps at three-fourths-symbol intervals.

DETAILED DESCRIPTION OF THE PREFERRED EMBODIMENT

Figure 1A:
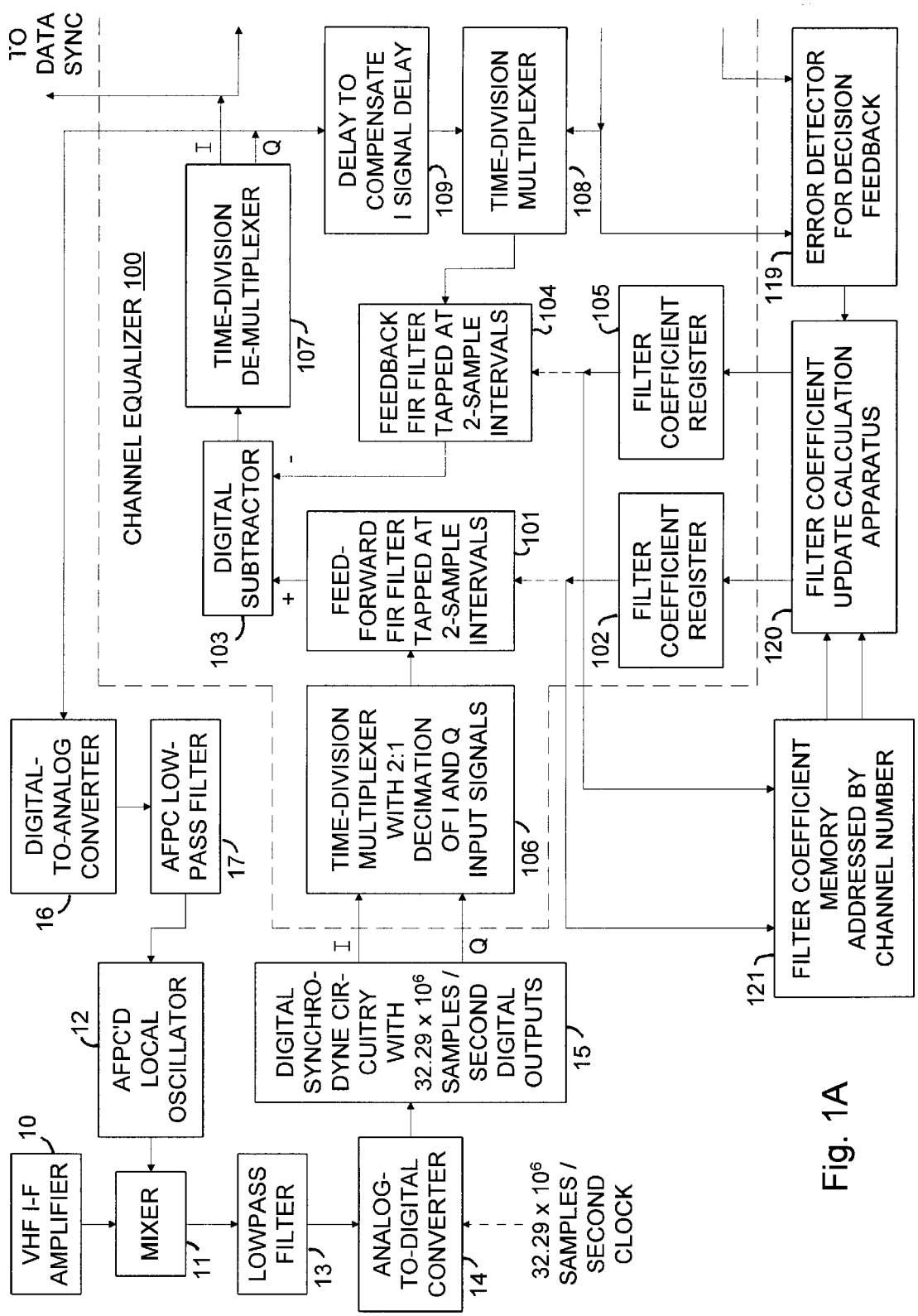

FIG. 1A shows a portion of a channel equalizer 100 that is a fractional equalizer with taps at two-thirds-symbol spacing designed for incorporation into a digital television (DTV) signal receiver, which channel equalizer 100 processes both in-phase and quadrature-phase synchrodyne results in accordance with the invention. The initial superheterodyne portions of the receiver, which are conventional in form and which supply very-high-frequency intermediate-frequency signal in response to a selected radio-frequency DTV signal, are not shown in FIG. 1A. The VHF I-F signal is applied to a VHF I-F amplifier 10, which supplies amplified response to the VHF I-F signal to a mixer 11 of multiplicative type for mixing with very-high-frequency oscillations from a local oscillator 12. The frequency of these oscillations has a nominal value such that a component of the mixer 11 output signal has a carrier frequency of 6.547 megahertz and resides in a band offset from zero frequency by a little more than one megahertz.

The mixer output signal is supplied to a lowpass filter 13, which suppresses image frequencies and limits the bandwidth of this component of mixer output signal as supplied to an analog-to-digital converter 14 for digitization. The ADC 14 samples the lowpass filter 13 response at a 32.287 million samples per second rate, which is three times the symbol rate of DTV signals broadcast in accordance with the Advanced Television Systems Committee (ATSC) standard for DTV broadcasting.

The ADC 14 response is supplied to digital synchrodyne circuitry 15, which responds to generate in-phase and quadrature-phase baseband signals supplied to the channel equalizer 100. The digital synchrodyne circuitry 15 can be of the general type described in U.S. Pat. No. 5,479,449 and more recently refined as described by A. L. R. Limberg in U.S. patent application ser. No. 09/396,446 filed Sep. 25, 1998 and titled "BANDPASS TRACKER APPARATUS THAT AUTOMATICALLY SAMPLES AT PRESCRIBED CARRIER PHASING WHEN DIGITIZING VSB I-F SIGNAL", claiming priority from a similarly titled provisional U.S. patent application ser. No. 60/101,799 filed Sep. 25, 1998.

The portion of the channel equalizer 100 shown in FIG. 1A comprises a finite-impulse-response (FIR) digital filter 101 having filtering coefficients stored in a temporary storage register 102, a digital subtractor 103, and an FIR digital filter 104 having filtering coefficients stored in a temporary storage register 105. The FIR filter 101 is operated in the channel equalizer 100 as a feed-forward FIR filter for suppressing near ghosts. The feed-forward FIR filter 101 helps suppress pre-ghosts, multipath responses that are received earlier than the principal DTV signal is received. The subtractor 103, the FIR filter 104 and feedback connections to be described combine to provide an infinite-impulse-response (IIR) filter. The FIR filter 104 is operated as a feedback FIR filter in this IIR filter. This IIR filter helps suppress post-ghosts, multipath responses that are received later than the principal DTV signal is received. The channel equalizer 100 as thusfar described resembles certain channel equalizers known in the prior art.

The channel equalizer 100 differs from previous channel equalizers, as known in the prior art or as described by the inventors in their previous patent applications, insofar as provisions made for operation as a dual-phase filter, for applying adaptive channel equalization to the quadrature-phase baseband signal as well as to the in-phase baseband signal. The channel equalizer 100 includes a time-division multiplexer 106 for performing two-to-one decimations on the in-phase and quadrature-phase baseband signals generated by the digital synchrodyne circuitry 15 and interleaving the decimation results on an alternating-sample basis to generate a 32.287 million samples per second input signal for the feed-forward FIR filter 101. FIG. 1A shows the subtractor 103 connecting to a time-division de-multiplexer 107 in the channel equalizer 100 for supplying the subtractor 103 difference output signal to the de-multiplexer 107 as input signal. The de-multiplexer 107 separates the channel equalizer 100 responses to the in-phase and quadrature-phase baseband signals. The de-multiplexer 107 supplies the equalized quadrature-phase baseband signal as so separated as a quadrature-phase baseband output signal of the channel equalizer 100, which is applied to a digital-to-analog converter 16. The resulting analog equalized quadrature-phase baseband signal supplied by the DAC 16 is applied as input signal to a lowpass filter 17, the response of which is applied to the local oscillator 12 as an automatic frequency and phase control (AFPC) signal.

The channel equalizer 100 includes a time-division multiplexer 108 for interleaving an in-phase feedback signal and a quadrature-phase feedback signal on an alternate-sample basis for generating an input signal to the feedback FIR filter 104. The quadrature-phase feedback signal received by the time-division multiplexer 108 as one of its input signals is the equalized quadrature-phase baseband signal supplied by the de-multiplexer 107 and delayed by delay circuitry 109.

Figure 1B:
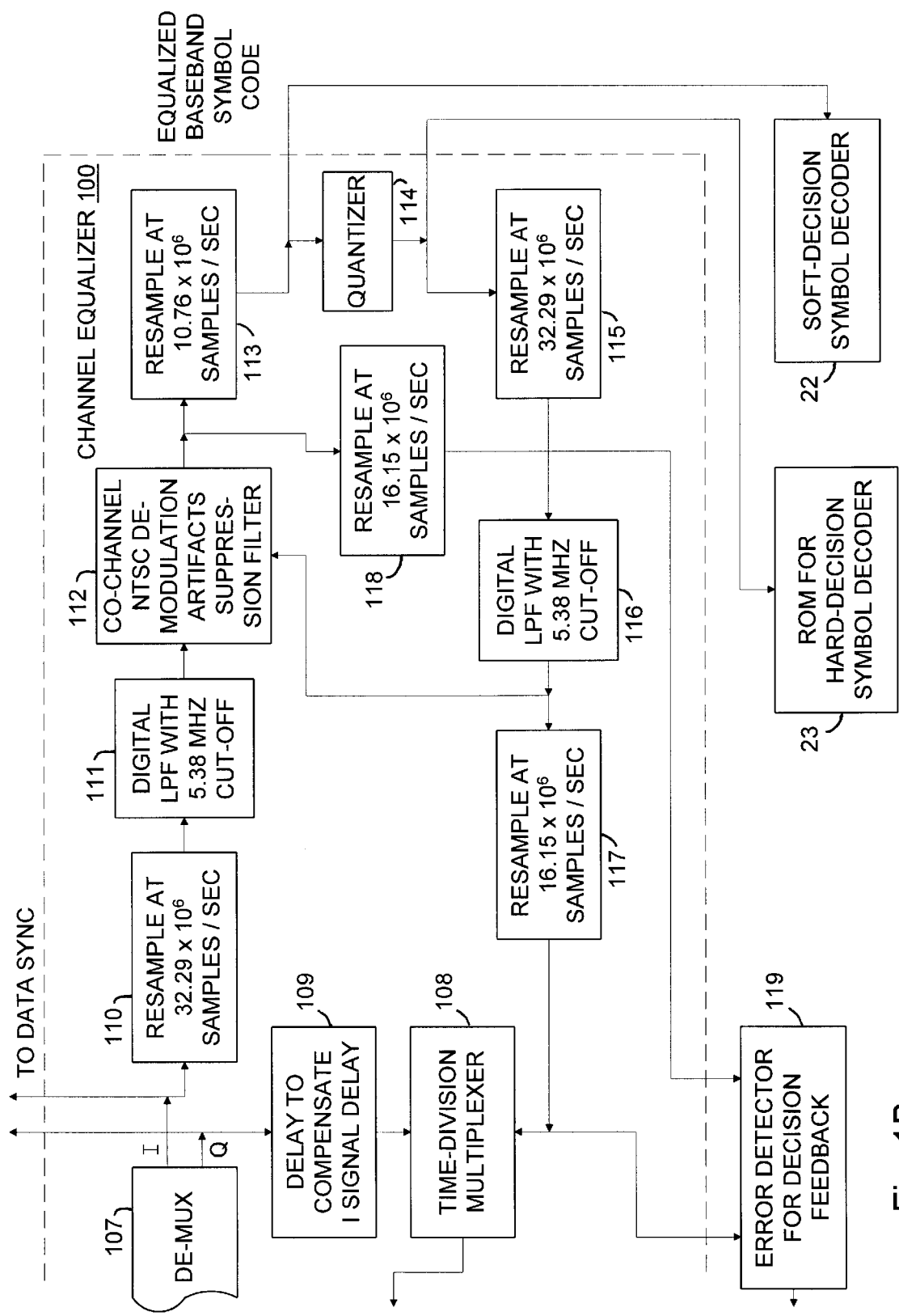

The in-phase feedback signal received by the time-division multiplexer 108 as the other of its input signals is generated by techniques new in the art, this being done in a portion of the channel equalizer 100 shown in FIG. 1B. FIG. 1B shows the de-multiplexer 107 connected for applying equalized in-phase baseband signal to an interpolation filter, which suppresses aliasing in its response to the equalized inphase baseband signal separated by the de-multiplexer 107. A re-sampler 110 and an FIR digital lowpass filter 111 provide this interpolation filter, which supplies equalized in-phase baseband signal at a 32.287 million samples per second rate to a filter 112 for suppressing demodulation artifacts of co-channel NTSC interference. The filter 112 for suppressing demodulation artifacts of co-channel NTSC interference is, by way of example, of a type described in U.S. patent application ser. No. 09/373,588 filed Aug. 13, 1999. This type is a variant of the co-channel NTSC artifacts suppression filter described in U.S. patent application ser. No. 09/335,515 titled "DTV RECEIVER SYMBOL DECODING CIRCUITRY WITH CO-CHANNEL NTSC ARTIFACTS SUPPRESSION FILTER BEFORE DATA SLICER" and filed Jun. 18, 1999 for A. L. R. Limberg, claiming priority from the similarly titled provisional U.S. patent application ser. No. 60/089,920 filed Jun. 19, 1998.

The re-sampler 110 double-samples at 32.287 million samples per second rate the equalized in-phase baseband signal as supplied by the de-multiplexer 107 at a 16.143 million samples per second rate; and the lowpass filter 111 rolls off system function response at a 5.38 MHz cut-off frequency, to facilitate subsequent decimation and quantization without incurring intersymbol interference. Increasing the sample rate of the equalized in-phase baseband signal to 32.287 million samples per second rate, a multiple of the symbol rate, permits a re-sampler 113 to implement a three-to-one decimation to the 10.762 million samples per second symbol rate simply by selecting every third sample as output signal and ignoring the other samples in generating its output signal. The re-sampler 113 is connected to apply the equalized in-phase baseband signal, as filtered to suppress demodulation artifacts of co-channel NTSC interference and converted to 10.762 million samples per second rate, to a data-slicer or quantizer 114. Responsive to such input signal, the quantizer 114 generates estimates of the symbols actually transmitted by the DTV transmitter. The estimates are generated at the 10.762 million samples per second symbol rate.

A re-sampler 115 triple-samples these estimates of the symbols actually transmitted by the DTV transmitter to generate an input signal at 32.287 million samples per second rate for an FIR digital lowpass filter 116 that rolls off system function response at a 5.38 MHz cut-off frequency. The filter 116 response is supplied to the filter 112 for suppressing demodulation artifacts of co-channel NTSC interference. A re-sampler 117 is connected to receive the filter 116 response and decimates it two-to-one to generate a signal at the 16.143 million samples per second rate, which signal corresponds to the estimates of the symbols actually transmitted by the DTV transmitter and is supplied to the time-division multiplexer 108 as the in-phase feedback signal.

The re-sampler 117 output signal corresponding to the estimates of the symbols actually transmitted by the DTV transmitter is also supplied to an error detector 119, which is used to generate a decision feedback signal indicative of how much the in-phase baseband signal departs from these estimates. Another re-sampler 118 is connected to receive the filter 112 response and decimates it two-to-one to generate a signal at the 16.143 million samples per second rate. This signal from the re-sampler 118 corresponds to the in-phase baseband signal as actually received after equalization and filtering, which signal is supplied to the error detector 119 for comparison with the re-sampler 117 output signal to generate the decision feedback-signal. The decision feedback-signal is supplied to filter-coefficient-update calculation apparatus 120.

The contents of the temporary storage register 102 that holds the adaptive filter coefficients for the feed-forward FIR filter 101 and the contents of the temporary storage register 105 that holds the adaptive filter coefficients for the feedback FIR filter 104 are recurrently written into a filter coefficient memory 121 addressed by the number of the channel that is currently received. When the DTV receiver is first powered or when the channel selected for reception is changed, the filter-coefficient-update calculation apparatus 120 initially loads the temporary storage registers 102 and 105 with the filter coefficients for the channel that presently will be received. Thereafter, the filter-coefficient-update calculation apparatus 120 updates the contents of the temporary storage registers 102 and 105 responsive to the decision feedback-signal supplied from the error detector 119.

Each of the temporary storage registers 102 and 105 is dual-ported, comprising a serial-in/parallel-out (or SIPO) component register and a parallel-in/parallel-out (or PIPO) component register. The initial stage of the SIPO component register can be serially written through a serial-input port; and the final output stage of the SIPO component register can be serially read through a serial-output port, which permits selective looping of the SIPO component register. Upon command, the stages of the PIPO component register are loaded in parallel from corresponding stages of the SIPO component register. The stages of the PIPO component register in the temporary storage register 102 supply their stored computer coefficients in parallel to digital multipliers in the FIR filter 101. The stages of the PIPO component register in the temporary storage register 105 supply their stored computer coefficients in parallel to digital multipliers in the FIR filter 104.

After initial adaptive filter coefficients for the FIR filters 101 and 104 are established, the calculation apparatus 120 inputs the adaptive filter coefficients temporarily stored in the registers 102 and 105, then updates the adaptive filter coefficients using correction accumulation procedures. The corrections to be used in these accumulation procedures are generated as fractions of errors detected by the error detector 119 for generating decision-feedback signal.

FIG. 1B shows a symbol decoder 22 of soft-decision type (e.g., using the Viterbi algorithm) connected to the re-sampler 113 for receiving equalized in-phase baseband signal as converted to 10.762 million samples per second rate by the re-sampler 113. FIG. 1B also shows a read-only memory 23 connected to receive the data-slicer or quantizer 114 output signal as input addressing and operated to implement symbol decoding of a hard-decision type. Either type of symbol decoding or both soft-decision and hard-decision types of symbol decoding can be employed in a DTV receiver embodying the invention.

When the transition from NTSC analog television broadcasting to digital television broadcasting is completed, the co-channel NTSC demodulation artifacts filter 112 will no longer be needed in the channel equalizer 100. The channel equalizer 100 design can then be modified to apply the response of the lowpass filter 111 directly to the re-sampler 113 as its input signal and to the re-sampler 118 as its input signal, with the filter 112 being dispensed with.

Figure 2A:
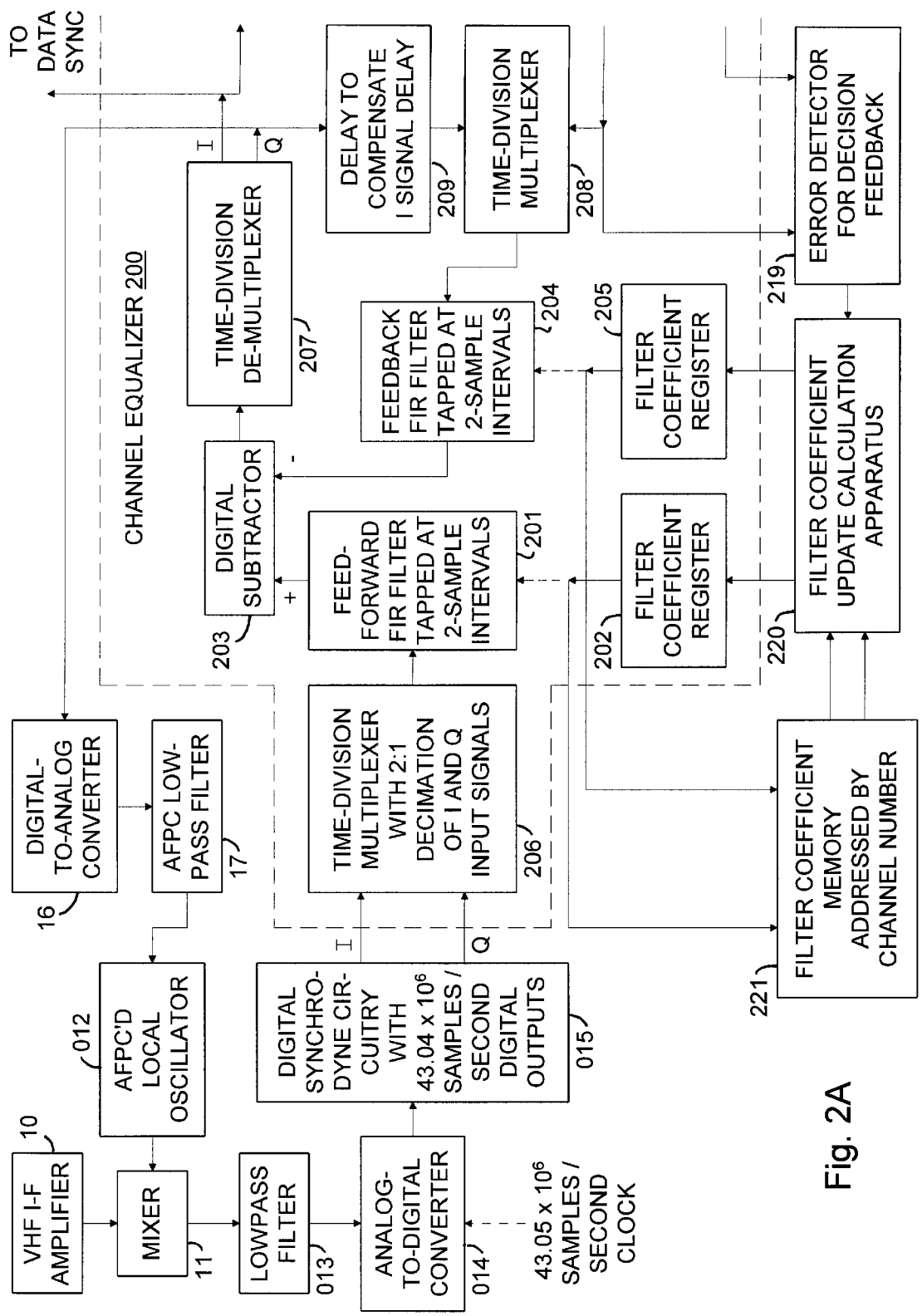
Figure 2B:
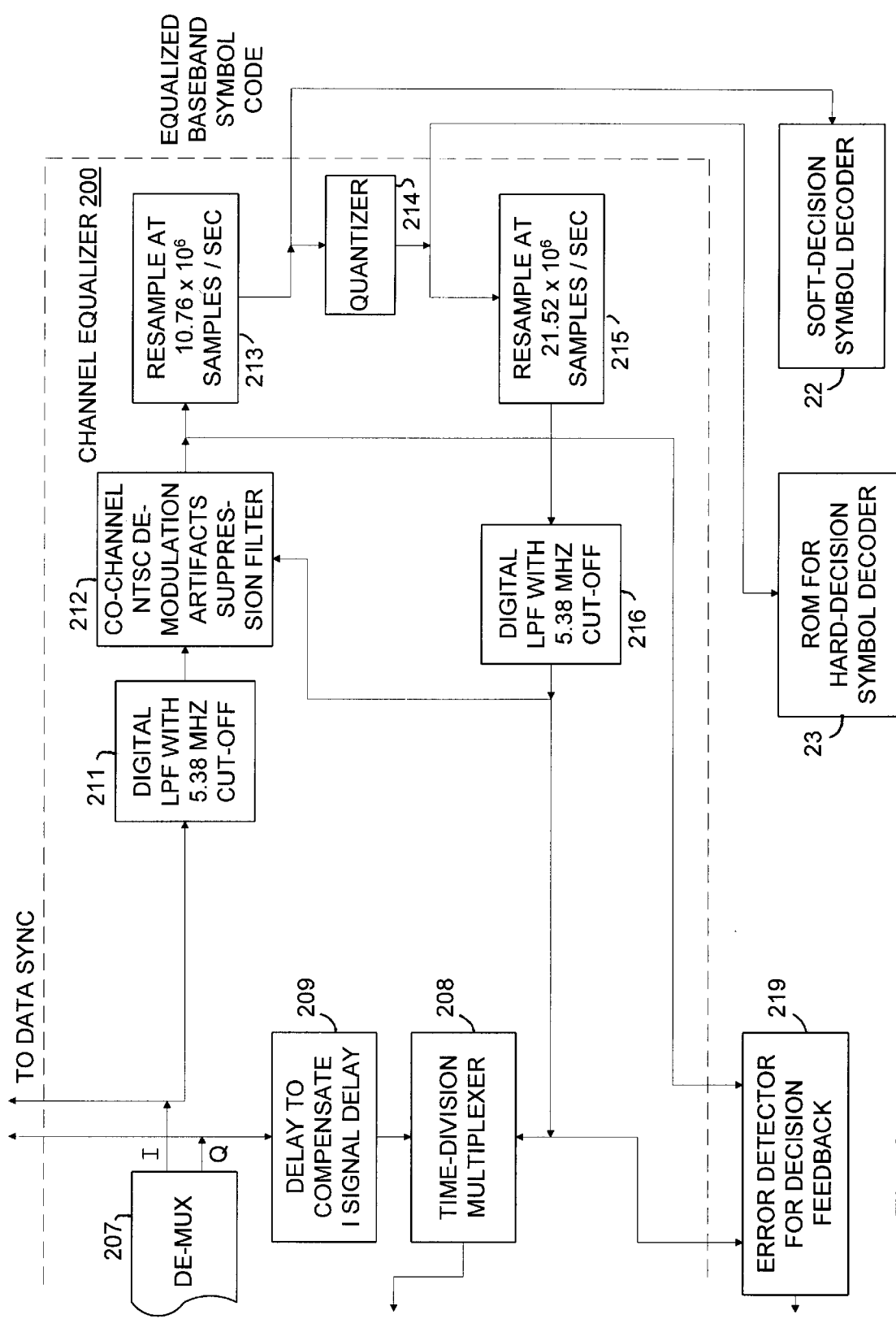

FIGS. 2A and 2B show a portion of a DTV signal receiver including a channel equalizer 200 that is a fractional equalizer with taps at one-half-symbol spacing designed for incorporation into a digital television (DTV) signal receiver, which channel equalizer 200 processes both in-phase and quadrature-phase synchrodyne results in accordance with the invention. An analog-to-digital converter 014 and digital synchrodyne circuitry 015 in FIG. 2A differ from the analog-to-digital converter 14 and the digital synchrodyne circuitry 15 in FIG. 1A in that the elements 014 and 015 operate at a 43.049 million samples per second rate, which is four times the symbol rate of DTV signals broadcast in accordance with the ATSC standard. The digital synchrodyne circuitry 015 responds to ADC 014 response to generate in-phase and quadrature-phase baseband signals supplied to the channel equalizer 200. An AFPC'd local oscillator 012 and an analog lowpass filter 013 in FIG. 2A differ slightly from the AFPC'd local oscillator 12 and the analog lowpass filter 13 in FIG. 1A. The frequency of controlled oscillations from the AFPC'd local oscillator 012 preferably has a nominal value such that a component of the mixer 11 output signal has a carrier frequency that is a submultiple of 43.049 MHz chosen so the final intermediate-frequency signal resides in a band offset from zero frequency by around a megahertz or so. A carrier frequency of 7.175 MHz is suitable, for example, supposing the VSB carrier is at the higher-frequency end of the final intermediate-frequency band, and the cut-off frequency of the analog lowpass filter 013 is chosen accordingly.

The portion of the channel equalizer 200 shown in FIG. 1A comprises a FIR digital filter 201 having filtering coefficients stored in a temporary storage register 202, a digital subtractor 203, and an FIR digital filter 204 having filtering coefficients stored in a temporary storage register 205. The FIR filter 201 is operated as a feed-forward FIR filter for suppressing near ghosts and for helping suppress pre-ghosts. The subtractor 203, the FIR filter 204 and feedback connections to be described combine to provide an IIR filter. The FIR filter 204 is operated as a feedback FIR filter in this IIR filter helping to suppress post-ghosts.

The channel equalizer 200 includes a time-division multiplexer 206 for performing two-to-one decimations on the in-phase and quadrature-phase baseband signals generated by the digital synchrodyne circuitry 015 and interleaving the decimation results on an alternating-sample basis to generate a 43.049 million samples per second input signal for the feed-forward FIR filter 201. FIG. 2A shows the subtractor 203 connecting to a time-division de-multiplexer 207 in the channel equalizer 200 for supplying the subtractor 203 difference output signal to the de-multiplexer 207 as input signal. The de-multiplexer 207 separates the channel equalizer 200 responses to the in-phase and quadrature-phase baseband signals. The de-multiplexer 207 supplies the equalized quadrature-phase baseband signal as so separated as a quadrature-phase baseband output signal of the channel equalizer 200, which is applied to the digital-to-analog converter 16. The resulting analog equalized quadrature-phase baseband signal supplied by the DAC 16 is applied as input signal to the lowpass filter 17, the response of which is applied to the local oscillator 012 as an automatic frequency and phase control (AFPC) signal.

The channel equalizer 200 includes a time-division multiplexer 208 for interleaving an in-phase feedback signal and a quadrature-phase feedback signal on an alternate-sample basis for generating an input signal to the feedback FIR filter 204. The quadrature-phase feedback signal received by the time-division multiplexer 208 as one of its input signals is the equalized quadrature-phase baseband signal supplied by the de-multiplexer 207 and delayed by delay circuitry 209.

Figure 3A:
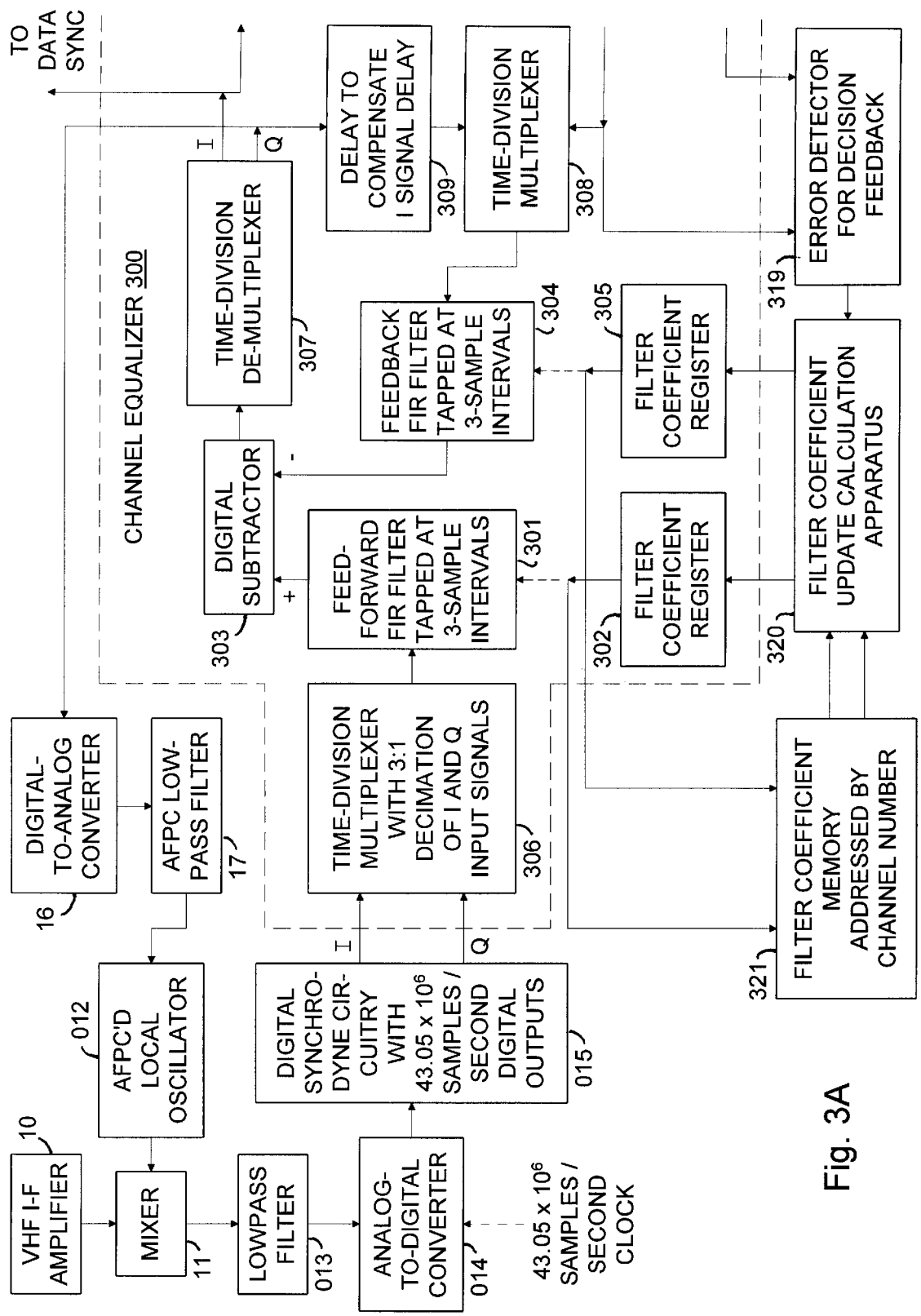
Figure 3B:
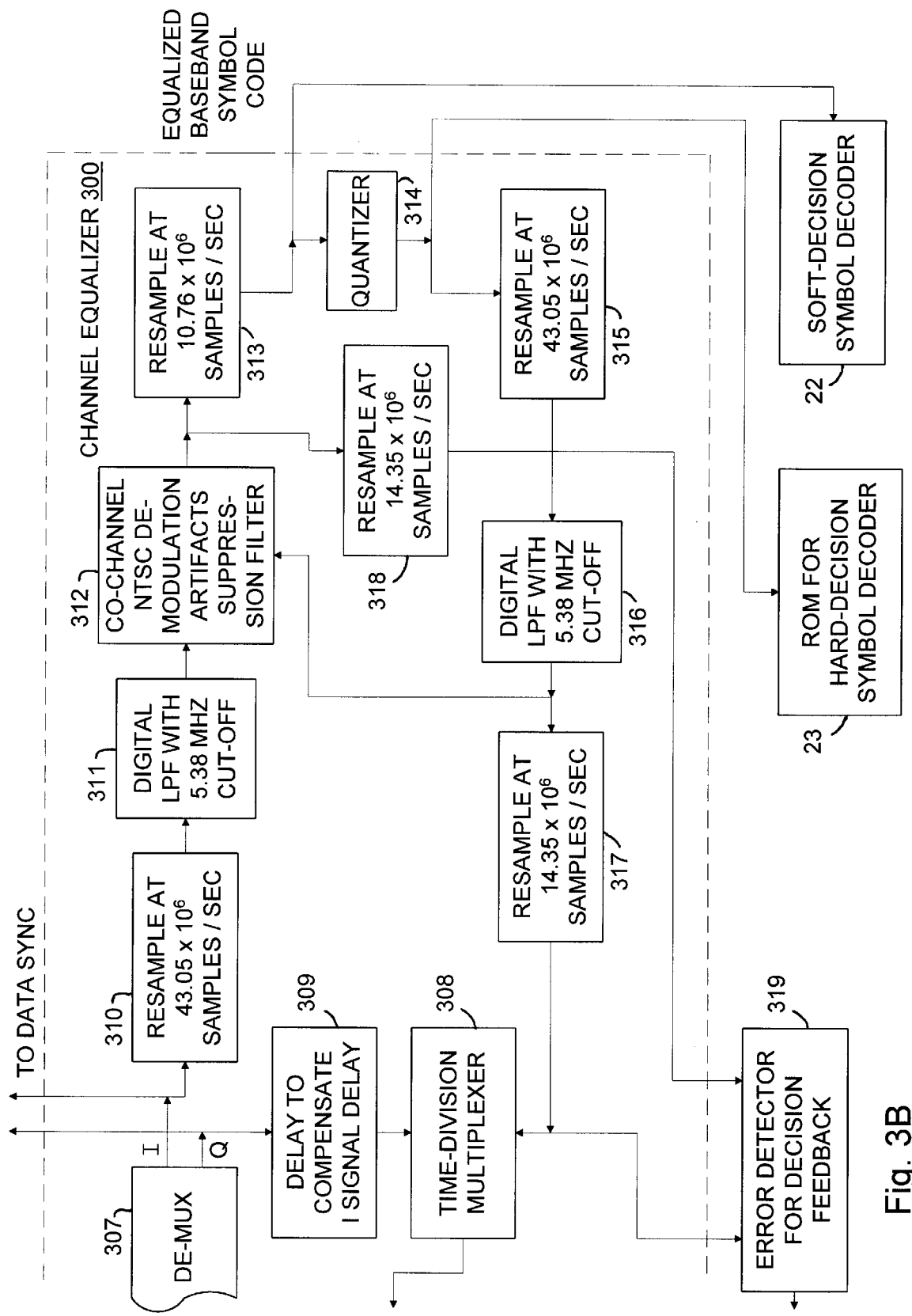

The in-phase feedback signal received by the time-division multiplexer 208 as the other of its input signals is generated in a portion of the channel equalizer 200 shown in FIG. 3B. The de-multiplexer 207 supplies the equalized in-phase baseband signal to an FIR digital lowpass filter 211 that rolls off system function response at a 5.38 MHz cut-off frequency, to facilitate subsequent decimation and quantization without incurring intersymbol interference. Since the equalized in-phase baseband signal separated by the de-multiplexer 207 is already at an integer multiple of symbol rate, resampling is not necessary so that the filter 211 response supplied to a filter 212 for suppressing demodulation artifacts of co-channel NTSC interference will be an integer multiple of DTV symbol rate. The filter 212 for suppressing demodulation artifacts of co-channel NTSC interference is, for example, of a type described in U.S. patent application ser. No. 09/373,588 filed Aug. 13, 1999.

A re-sampler 213 selects every other sample of the filter 212 response as its own output signal, implementing a two-to-one decimation of the filter 212 response to the 10.762 million samples per second symbol rate. The re-sampler 213 is connected to apply the equalized in-phase baseband signal, as filtered to suppress demodulation artifacts of co-channel NTSC interference and converted to 10.762 million samples per second rate, to a data-slicer or quantizer 214. Responsive to such input signal, the quantizer 214 generates estimates of the symbols actually transmitted by the DTV transmitter at the 10.762 million samples per second symbol rate.

A re-sampler 215 double-samples these estimates of the symbols actually transmitted by the DTV transmitter to generate an input signal at 21.524 million samples per second rate for an FIR digital lowpass filter 216 that rolls off system function response at a 5.38 MHz cut-off frequency. The filter 216 response is supplied to the filter 212 for suppressing demodulation artifacts of co-channel NTSC interference. The filter 216 response is supplied to the time-division multiplexer 208 as the in-phase feedback signal.

The filter 216 response corresponding to the estimates of the symbols actually transmitted by the DTV transmitter is also supplied to an error detector 219, which is used to generate a decision feedback signal indicative of how much the in-phase baseband signal departs from these estimates. The filter 212 response corresponds to the in-phase baseband signal as actually received after equalization and filtering, which signal is supplied to the error detector 219 for comparison with the filter 216 response to generate the decision feedback-signal. The decision feedback-signal is supplied to filter-coefficient-update calculation apparatus 220.

The contents of the temporary storage register 202 that holds the adaptive filter coefficients for the feed-forward FIR filter 201 and the contents of the temporary storage register 205 that holds the adaptive filter coefficients for the feedback FIR filter 204 are recurrently written into a filter coefficient memory 221 addressed by the number of the channel that is currently received. When the DTV receiver is first powered or when the channel selected for reception is changed, the filter-coefficient-update calculation apparatus 220 initially loads the temporary storage registers 202 and 205 with the filter coefficients for the channel that presently will be received. Thereafter, the filter-coefficient-update calculation apparatus 220 updates the contents of the temporary storage registers 202 and 205 responsive to the decision feedback-signal supplied from the error detector 219.

Each of the temporary storage registers 202 and 205 is dual-ported, comprising a serial-in/parallel-out (or SIPO) component register and a parallel-in/parallel-out (or PIPO) component register. The initial stage of the SIPO component register can be serially written through a serial-input port; and the final output stage of the SIPO component register can be serially read through a serial-output port, which permits selective looping of the SIPO component register. Upon command, the stages of the PIPO component register are loaded in parallel from corresponding stages of the SIPO component register. The stages of the PIPO component register in the temporary storage register 202 supply their stored computer coefficients in parallel to digital multipliers in the FIR filter 201. The stages of the PIPO component register in the temporary storage register 205 supply their stored computer coefficients in parallel to digital multipliers in the FIR filter 204.

After initial adaptive filter coefficients for the FIR filters 201 and 204 are established, the calculation apparatus 220 inputs the adaptive filter coefficients temporarily stored in the registers 202 and 205, then updates the adaptive filter coefficients using correction accumulation procedures. The corrections to be used in these accumulation procedures are generated as fractions of errors detected by the error detector 219 for generating decision-feedback signal.

When the transition from NTSC analog television broadcasting to digital television broadcasting is completed, the co-channel NTSC demodulation artifacts filter 212 will no longer be needed in the channel equalizer 200. The channel equalizer 200 design can then be modified to apply the response of the lowpass filter 211 directly to the re-sampler 213 as its input signal and to the re-sampler 218 as its input signal, with the filter 212 being dispensed with.

FIGS. 3A and 3B show a portion of a DTV signal receiver including a channel equalizer 300 that is a fractional equalizer with taps at three-quarters-symbol spacing designed for incorporation into a digital television (DTV) signal receiver, which channel equalizer 300 processes both in-phase and quadrature-phase synchrodyne results in accordance with the invention. The initial superheterodyne portions of the receiver, which are conventional in form and which supply very-high-frequency intermediate-frequency signal in response to a selected radio-frequency DTV signal, are not shown in FIG. 3A. The VHF I-F signal is applied to a VHF I-F amplifier 10, which supplies amplified response to the VHF I-F signal to a mixer 11 of multiplicative type for mixing with very-high-frequency oscillations from the local oscillator 012. The frequency of these oscillations has a nominal value such that a component of the mixer 11 output signal has a carrier frequency of 7.175 MHz megahertz, for example. The AFPC'd local oscillator 012, the analog lowpass filter 013, the analog-to-digital converter 014 and digital synchrodyne circuitry 015 in FIG. 3A are connected the same and operate the same as those elements do in FIG. 2A. The ADC 014 and the digital synchrodyne circuitry 015 operate at a 43.049 million samples per second rate, which is four times the symbol rate of DTV signals broadcast in accordance with the ATSC standard. The digital synchrodyne circuitry 015 responds to ADC 014 response to generate in-phase and quadrature-phase baseband signals supplied to the channel equalizer 300.

The portion of the channel equalizer 300 shown in FIG. 3A comprises a finite-impulse-response (FIR) digital filter 301 having filtering coefficients stored in a temporary storage register 302, a digital subtractor 303, and an FIR digital filter 304 having filtering coefficients stored in a temporary storage register 305. The FIR filter 301 is operated in the channel equalizer 300 as a feed-forward FIR filter for suppressing near ghosts and helping suppress pre-ghosts. The subtractor 303, the FIR filter 304 and feedback connections to be described combine to provide an IIR filter. The FIR filter 304 is operated as a feedback FIR filter in this IIR filter helping to suppress post-ghosts.

The channel equalizer 300 is constructed for operation as a triple-phase filter, one phase of the filter applying adaptive channel equalization to the in-phase baseband signal, another phase of the filter applying adaptive channel equalization to the quadrature-phase baseband signal, and the remaining phase of the filter being unused. The channel equalizer 300 includes a time-division multiplexer 306 for performing three-to-one decimation of the in-phase baseband signal generated by the digital synchrodyne circuitry 015 and for performing three-to-one decimation of the quadrature-phase baseband signal generated by the digital synchrodyne circuitry 015. FIG. 3A shows the subtractor 303 connected for supplying the subtractor 303 difference output signal to the time-division de-multiplexer 307 as input signal. The de-multiplexer 307 separates the channel equalizer 300 responses to the in-phase and quadrature-phase baseband signals. The de-multiplexer 307 supplies the digital-to-analog converter 16 the equalized quadrature-phase baseband signal as so separated, as a quadrature-phase baseband output signal of the channel equalizer 300. The equalized quadrature-phase baseband signal is supplied at 14.350 million samples per second rate to the DAC 16. The resulting analog equalized quadrature-phase baseband signal supplied by the DAC 16 is applied as input signal to a lowpass filter 17, the response of which is applied to the local oscillator 012 as its AFPC signal.

The channel equalizer 300 includes a time-division multiplexer 308 for time-interleaving an in-phase feedback signal, a quadrature-phase feedback signal, and a null-samples signal to generate input signal for the feedback FIR filter 304. The quadrature-phase feedback signal received by the time-division multiplexer 308 as one of its input signals is the equalized quadrature-phase baseband signal supplied by the de-multiplexer 307 and delayed by delay circuitry 309.

The in-phase feedback signal received by the time-division multiplexer 308 as another of its input signals is generated by techniques similar to those used in the channel equalizer 100 described supra with reference to FIG. 1B. FIG. 3B shows the de-multiplexer 307 connected for applying equalized in-phase baseband signal to an interpolation filter, which suppresses aliasing in its response to the equalized in-phase baseband signal separated by the de-multiplexer 307. A re-sampler 310 and an FIR digital lowpass filter 311 provide this interpolation filter, which supplies equalized in-phase baseband signal at a 43.049 million samples per second rate to a filter 312 for suppressing demodulation artifacts of co-channel NTSC is interference. The filter 312 for suppressing demodulation artifacts of co-channel NTSC interference is, for example, of a type described in U.S. patent application ser. No. 09/373,588 filed Aug. 13, 1999.

The re-sampler 310 triple-samples at 43.049 million samples per second rate the equalized in-phase baseband signal as supplied by the de-multiplexer 307 at a 14.350 million samples per second rate; and the lowpass filter 311 rolls off system function response at a 5.38 MHz cut-off frequency, to facilitate subsequent decimation and quantization without incurring intersymbol interference. Increasing the sample rate of the equalized in-phase baseband signal to 43.049 million samples per second rate, a multiple of the symbol rate, permits a re-sampler 313 to implement a four-to-one decimation to the 10.762 million samples per second symbol rate simply by selecting every fourth sample as output signal and ignoring the other samples in generating its output signal. The re-sampler 313 is connected to apply the equalized in-phase baseband signal, as filtered to suppress demodulation artifacts of co-channel NTSC interference and converted to 10.762 million samples per second rate, to a data-slicer or quantizer 314. Responsive to such input signal, the quantizer 314 generates estimates of the symbols actually transmitted by the DTV transmitter. The estimates are generated at the 10.762 million samples per second symbol rate.

A re-sampler 315 quadruple-samples these estimates of the symbols actually transmitted by the DTV transmitter to generate an input signal at 43.049 million samples per second rate for an FIR digital lowpass filter 316 that rolls off system function response at a 5.38 MHz cut-off frequency. The filter 316 response is supplied to the filter 312 for suppressing demodulation artifacts of co-channel NTSC interference. A re-sampler 317 is connected to receive the filter 316 response and decimates it three-to-one to generate a signal at the 14.350 million samples per second rate, which signal corresponds to the estimates of the symbols actually transmitted by the DTV transmitter and is supplied to the time-division multiplexer 308 as the in-phase feedback signal.

The re-sampler 317 output signal corresponding to the estimates of the symbols actually transmitted by the DTV transmitter is also supplied to an error detector 319, which is used to generate a decision feedback signal indicative of how much the in-phase baseband signal departs from these estimates. Another re-sampler 318 is connected to receive the filter 312 response and decimates it three-to-one to generate a signal at the 14.350 million samples per second rate. This signal from the re-sampler 318 corresponds to the in-phase baseband signal as actually received after equalization and filtering, which signal is supplied to the error detector 319 for comparison with the re-sampler 317 output signal to generate the decision feedback-signal. The decision feedback-signal is supplied to filter-coefficient-update calculation apparatus 320.

The contents of the temporary storage register 302 that holds the adaptive filter coefficients for the feed-forward FIR filter 301 and the contents of the temporary storage register 305 that holds the adaptive filter coefficients for the feedback FIR filter 304 are recurrently written into a filter coefficient memory 321 addressed by the number of the channel that is currently received. When the DTV receiver is first powered or when the channel selected for reception is changed, the filter-coefficient-update calculation apparatus 320 initially loads the temporary storage registers 302 and 305 with the filter coefficients for the channel that presently will be received. Thereafter, the filter-coefficient-update calculation apparatus 320 updates the contents of the temporary storage registers 302 and 305 responsive to the decision feedback-signal supplied from the error detector 319.

Each of the temporary storage registers 302 and 305 is dual-ported, comprising a serial-in/parallel-out (or SIPO) component register and a parallel-in/parallel-out (or PIPO)

component register. The initial stage of the SIPO component register can be serially written through a serial-input port; and the final output stage of the SIPO component register can be serially read through a serial-output port, which permits selective looping of the SIPO component register. Upon command, the stages of the PIPO component register are loaded in parallel from corresponding stages of the SIPO component register. The stages of the PIPO component register in the temporary storage register 302 supply their stored computer coefficients in parallel to digital multipliers in the FIR filter 301. The stages of the PIPO component register in the temporary storage register 305 supply their stored computer coefficients in parallel to digital multipliers in the FIR filter 304.

After initial adaptive filter coefficients for the FIR filters 301 and 304 are established, the calculation apparatus 320 inputs the adaptive filter coefficients temporarily stored in the registers 302 and 305, then updates the adaptive filter coefficients using correction accumulation procedures. The corrections to be used in these accumulation procedures are generated as fractions of errors detected by the error detector 319 for generating decision-feedback signal.

When the transition from NTSC analog television broadcasting to digital television broadcasting is completed, the co-channel NTSC demodulation artifacts filter 312 will no longer be needed in the channel equalizer 300. The channel equalizer 300 design can then be modified to apply the response of the lowpass filter 311 directly to the re-sampler 313 as its input signal and to the re-sampler 318 as its input signal, with the filter 312 being dispensed with.

The filter coefficient update apparatuses 120, 220 and 320 can be operated using the block-least-mean-squares algorithm, which lends itself to monolithic integration in a reasonable-size silicon die. The implementation of the block-LMS algorithm is described in considerable detail in U.S. Pat. No. 5,648,987 titled "RAPID-UPDATE ADAPTIVE CHANNEL-EQUALIZATION FILTERING FOR DIGITAL RADIO RECEIVERS, SUCH AS HDTV RECEIVERS", which issued Jul. 15, 1997 to J. Yang, C. B. Patel, T. Liu and A. L. R. Limberg.

Fractional equalizers with tap spacings at four-fifths, five-sixths, six-sevenths or seven-eighths of a symbol epoch appear in other embodiments of the invention.

FIGS. 1A, 3A and 5A each show downconversion to digital final intermediate-frequency signal being done in downconversion apparatus comprising the mixer 11, AFPC'd local oscillator 12, the lowpass filter 13 and the analog-to-digital converter 14. In other embodiments of the invention this downconversion apparatus is replaced by downconversion apparatus that also converts the VSB DTV signal to a double-sideband amplitude-modulation (DSB AM) signal. Such alternative downconversion apparatus is described in detail in U.S. patent application ser. No. 09/440, 469 filed Nov. 15, 1999 for A. L. R. Limberg and titled "DIGITAL TELEVISION RECEIVER CONVERTING VESTIGIAL-SIDEBAND SIGNALS TO DOUBLE-SIDEBAND AM SIGNALS BEFORE DEMODULATION".

Figure 4:
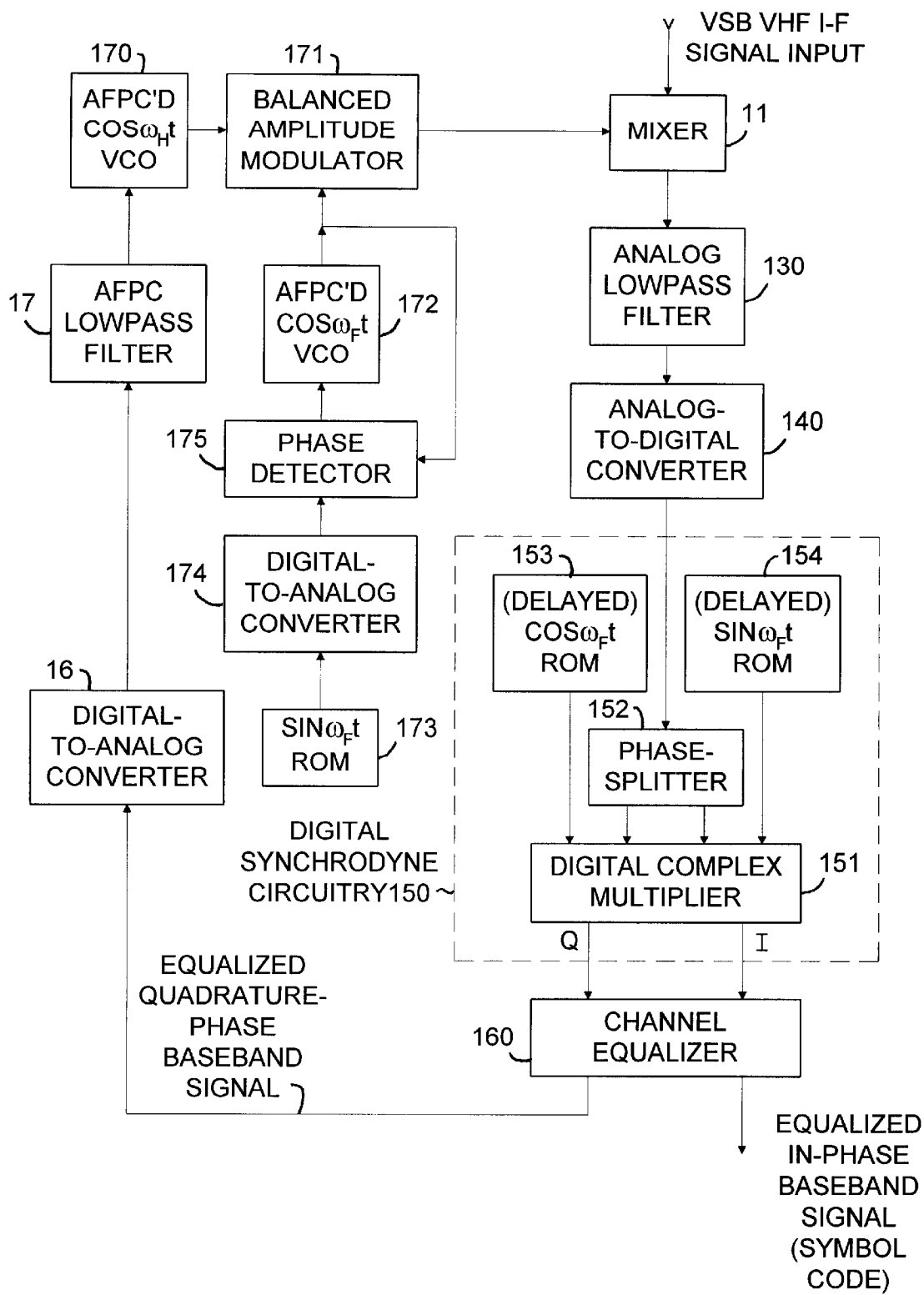
FIG. 4 is a block schematic diagram of apparatus for demodulating a vestigial-sideband amplitude-modulation signal, which apparatus downconverts that VSB signal to a double-sideband amplitude-modulation signal, which DSB AM signal

FIG. 4 shows one form that the downconversion apparatus for converting the VSB DTV signal to a DSB AM signal can take, when providing for baseband equalization of quadrature-phase as well as in-phase synchrodyne results in a digital radio receiver. An analog lowpass image-rejection filter 130, an analog-to-digital converter 140, digital synchrodyne circuitry 150, and a channel equalizer 160 of FIG. 4 are considered to correspond respectively to the analog lowpass filter 13, the analog-to-digital converter 14, the digital synchrodyne circuitry 15 and the channel equalizer 100 of FIGS. 1A and 1B, for example. Or, by way of other example, the analog lowpass filter 130, the analog-to-digital converter 140, the digital synchrodyne circuitry 150, and the channel equalizer 160 of FIG. 4 are considered to correspond respectively to the analog lowpass filter 013, the analog-to-digital converter 014, the digital synchrodyne circuitry 015 and the channel equalizer 200 of FIGS. 2A and 2B. Or in a still further example, the analog lowpass filter 130, the analog-to-digital converter 140, the digital synchrodyne circuitry 150, and the channel equalizer 160 of FIG. 4 are considered to correspond respectively to the analog lowpass filter 013, the analog-to-digital converter 014, the digital synchrodyne circuitry 015, and the channel equalizer 300 of FIGS. 3A and 3B. The digital synchrodyne circuitry 150 shown in FIG. 4 has typical construction, comprising a digital complex multiplier 151, a phase-splitter 152 for converting the samples from the ADC 140 to a complex multiplicand signal, and read-only memories 153 and 154 for supplying a complex multiplier signal. The ROMs 153 and 154 store $\cos\omega_F t$ and $\sin\omega_F t$ look-up tables, which are sequentially addressed in parallel to generate a complex digital carrier wave at a frequency of $\omega_F$ radians per second for the digital complex multiplier 151 to synchrodyne with the complex multiplicand signal supplied from the phase-splitter 152. In accordance with the invention, the in-phase (I) and quadrature-phase (Q) components of the complex product signal generated by the digital complex multiplier 151 are both subjected to channel equalization in the channel equalizer 160. The equalized in-phase baseband signal provides symbol code to the symbol decoding circuitry (not shown) in the DTV receiver.

The equalized quadrature-phase baseband signal is converted to analog signal by the DAC 16 and filtered by the AFPC lowpass filter 17 to supply automatic frequency and phase control signal to a voltage-controlled oscillator 170. The VCO 170 generates local oscillations at a nominal frequency of OH radians per second, the carrier frequency of the VSB VHF internediate-frequency input signal to the mixer 11. The VCO 170 supplies its $\cos\omega_H t$ oscillations as carrier wave to a balanced amplitude modulator 171 for modulation by $\cos\omega_F t$ oscillations from a voltage-controlled oscillator 172. The $\omega_F$ radians per second frequency is the design frequency for the final intermediate-frequency signal the lowpass filter 130 supplies the ADC 140 for digitization. The balanced amplitude modulator 171 supplies the mixer 11 a heterodyning signal essentially consisting of a first component of frequency ($\omega_H-\omega_F$) and a second component of frequency ($\omega_H-\omega_F$). The mixer 11 multiplies the VSB amplified VHF I-F signal by the heterodyning signal supplied by the amplitude-modulator 172. The resulting product output signal from the mixer 11 is lowpass filtered by the lowpass filter 130 to separate a DSB AM final I-F signal from its image in the VHF band.

The mixer 11 generates the DSB AM final I-F signal in the following way. The first component of frequency ($\omega_H-\omega_F$) of the balanced amplitude modulator 171 output signal downconverts the VSB VHF intermediate-frequency input signal to the final intermediate-frequency band without reversal of frequency spectrum order, with the carrier frequency being downconverted to the $\omega_F$ radians per second frequency. The second component of frequency ($\omega_H+\omega_F$) of the balanced amplitude modulator 171 output signal downconverts the VSB VHF intermediate-frequency input signal to the final intermediate-frequency band with a reversal of frequency spectrum order, with the carrier frequency being downconverted to the $\omega_F$ radians per second frequency.

A read-only memory 173 is sequentially addressed in parallel with the ROMs 153 and 154 that store $\cos\omega_F t$ and $\sin\omega_F t$ look-up tables, to generate $\sin\omega_F t$ digital carrier wave supplied as input signal to a digital-to-analog converter 174. The resulting analog $\sin\omega_F t$ digital carrier wave from the DAC 174 and the $\cos\omega_F t$ oscillations from a voltage-controlled oscillator 172 are compared in phase by a phase detector 175, the output signal from which phase detector 175 is applied to the VCO 172 as its automatic frequency and phase control signal. The phase detector 175 generates an error signal for the VCO 172 responsive to any departure from quadrature phase difference between the analog $\sin\omega_F t$ digital carrier wave from the DAC 174 and the $\cos\omega_F t$ oscillations from a voltage-controlled oscillator 172. The $\cos\omega_F t$ and $\sin\omega_F t$ functions stored in look-up tables in the ROMs 153 and 154 use a slightly delayed t compared to the $\sin\omega_F t$ function stored in look-up table form in the ROM 173 to compensate for small delays in the analog portions of the AFPC loops in the system.

Figure 5:
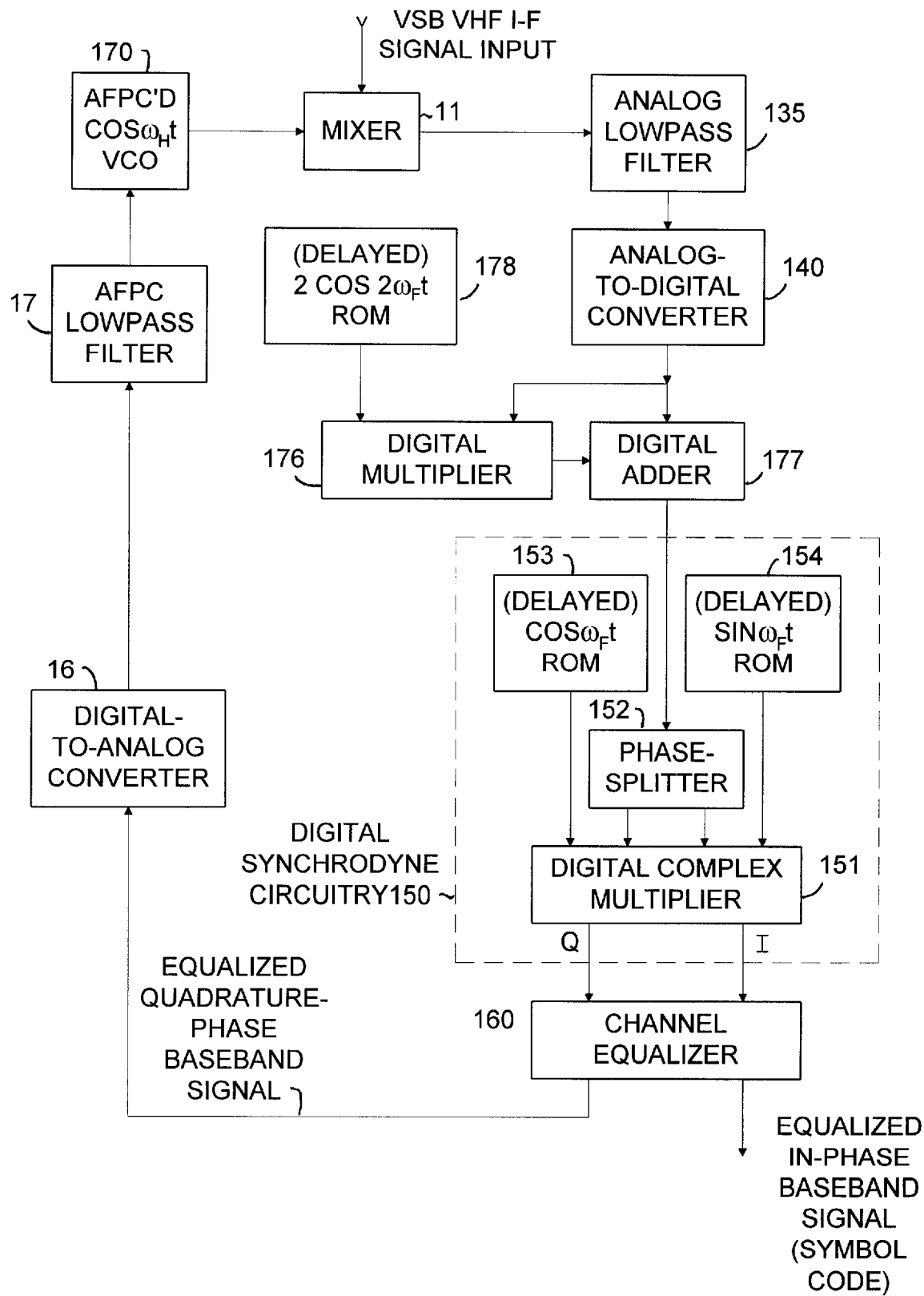
FIG. 5 is a block schematic diagram of apparatus for demodulating a vestigial-sideband amplitude-modulation signal, which apparatus downconverts that VSB signal to a double-sideband amplitude-modulation signal, which DSB AM signal is then digitized and demodulated using a digital complex multiplier.

FIG. 5 shows another form that the downconversion apparatus for converting the VSB DTV signal to a DSB AM signal can take, when providing for baseband equalization of quadrature-phase as well as in-phase synchrodyne results in a digital radio receiver. The VCO 170 supplies its $\cos\omega_H t$ oscillations directly to the mixer 11 in the FIG. 5 downconversion apparatus, and the balanced amplitude modulator 171 is not used. The analog lowpass filter 130 used in the FIG. 4 downconversion apparatus for separating a DSB AM final I-F signal from its image in the VHF band is replaced in the FIG. 5 downconversion apparatus by an analog lowpass filter 135 for separating a VSB final I-F signal from its image in the VHF band. Presuming that the carrier frequency is near the upper-frequency end of the final I-F band, the cut-off frequency of the lowpass filter 135 can be somewhat lower in frequency than the cut-off frequency of the lowpass filter 130, to reduce the noise bandwidth of the signal the lowpass filter 135 supplies to the ADC 140.

Conversion to DSB AM takes place in the FIG. 5 downconversion apparatus after digitization of the final I-F signal by the ADC 140, rather than taking place in the mixer 11 before the digitization of the final I-F signal by the ADC 140. A digital multiplier 176 multiplies the digitized final I-F signal from the ADC 140 by a $2 \cos 2\omega_F t$ term, and the resultant product is added to the digitized final I-F signal from the ADC 140 by a digital adder 177. The sum output signal from the adder 177 contains a DSB AM signal, and the adder 177 is connected to the phase-splitter 152 for applying this DSB AM signal as input signal thereto. The FIG. 5 downconversion apparatus does not include the elements 172–175 of the FIG. 4 downconversion apparatus. The FIG. 5 downconversion apparatus includes a read-only memory 178 that stores a $2 \cos 2\omega_F t$ look-up table and is sequentially addressed in parallel with the ROMs 153 and 154 that store $\cos\omega_F t$ and $\sin\omega_F t$ look-up tables.

Variations of the FIG. 4 and FIG. 5 downconversion apparatuses that are less preferable will be obvious to one skilled in the art of digital receiver design after acquaintance with the contents of U.S. patent application ser. No. 09/440,469 filed Nov. 15, 1999 for A. L. R. Limberg and titled "DIGITAL TELEVISION RECEIVER CONVERTING VESTIGIAL-SIDEBAND SIGNALS TO DOUBLE-SIDEBAND AM SIGNALS BEFORE DEMODULA-TION". These variations avoid the need for the phase-splitter 152, but require that mixing be done using complex-signal sampling procedures rather than just real-signal sampling procedures.

What is claimed is:

1. A radio receiver for digital transmissions, said radio receiver comprising:

a local oscillator for supplying local oscillations the frequency and phase of which are controlled by an automatic frequency and phase control signal;

a mixer for downconverting received digital transmissions by heterodyning them with said local oscillations to generate an intermediate-frequency signal;

synchrodyne circuitry for demodulating said intermediate-frequency signal to generate an in-phase baseband demodulation result and to generate a quadrature-phase baseband demodulation result;

equalization-and-ghost-cancellation-filtering circuitry having filtering parameters that are adjustable, for processing said in-phase baseband demodulation result to generate a first equalization-and-ghost-cancellation-filter response and for similarly processing said quadrature-phase baseband demodulation result to generate a second equalization-and-ghost-cancellation-filter response;

apparatus for adjusting the filtering parameters of said equalization-and-ghost-cancellation-filtering circuitry in response to portions of said in-phase baseband demodulation result;

a symbol decoder for decoding symbols in said first equalization-and-ghost-cancellation-filter response, thereby to recover data encoded in those said symbols; and circuitry for generating said automatic frequency and phase control signal by lowpass filtering said second equalization-and-ghost-cancellation-filter response.

2. The radio receiver of claim 1, wherein said equalization-and-ghost-cancellation-filtering circuitry is dual-phase equalization-and-ghost-cancellation-filtering circuitry for processing samples of said in-phase baseband demodulation result on a time-interleaved basis with samples of said quadrature-phase baseband demodulation result.

3. The radio receiver of claim 2, wherein said equalization-and-ghost-cancellation-filtering circuitry subjects the samples of said in-phase baseband demodulation result to fractional equalization at (n+1)/n times baud rate, n being a positive integer.

4. The radio receiver of claim 2, wherein said equalization-and-ghost-cancellation-filtering circuitry subjects the samples of said in-phase baseband demodulation result to fractional equalization at three-halves baud rate.

5. The radio receiver of claim 2, wherein said equalization-and-ghost-cancellation-filtering circuitry subjects the samples of said in-phase baseband demodulation result to fractional equalization at twice baud rate.

6. The radio receiver of claim 2, wherein said equalization-and-ghost-cancellation-filtering circuitry subjects the samples of said in-phase baseband demodulation result to fractional equalization at four-thirds baud rate.

* * * * *